US008618678B2

(12) United States Patent
Lin

(10) Patent No.: US 8,618,678 B2
(45) Date of Patent: Dec. 31, 2013

(54) CHIP STRUCTURE AND CHIP PACKAGE STRUCTURE

(75) Inventor: Chiu-Shun Lin, Tainan County (TW)

(73) Assignee: Himax Technologies Limited, Tainan (TW)

( * ) Notice: Subject to any disclaimer, the term of this patent is extended or adjusted under 35 U.S.C. 154(b) by 644 days.

(21) Appl. No.: 12/265,439

(22) Filed: Nov. 5, 2008

(65) Prior Publication Data
US 2010/0109157 A1 May 6, 2010

(51) Int. Cl.
*H01L 23/00* (2006.01)

(52) U.S. Cl.
USPC .......... 257/786; 257/775; 257/E23.151; 257/E23.07

(58) Field of Classification Search
USPC .......... 257/737, 778, 775, 786, E23.151, 257/E23.07
See application file for complete search history.

(56) References Cited

U.S. PATENT DOCUMENTS

| | | | | |
|---|---|---|---|---|
| 5,926,731 A | * | 7/1999 | Coapman et al. | 438/613 |
| 6,184,581 B1 | * | 2/2001 | Cornell et al. | 257/737 |
| 6,525,422 B1 | * | 2/2003 | Ono et al. | 257/737 |
| 2006/0163725 A1 | * | 7/2006 | Haba et al. | 257/737 |
| 2008/0023828 A1 | * | 1/2008 | Peng et al. | 257/737 |
| 2008/0023830 A1 | * | 1/2008 | Chang et al. | 257/737 |

FOREIGN PATENT DOCUMENTS

TW  200807669  2/2008

OTHER PUBLICATIONS

"Office Action of Taiwan Counterpart Application", issued on Apr. 6, 2012, p. 1-p. 7, in which the listed reference was cited.

\* cited by examiner

*Primary Examiner* — Wael Fahmy
*Assistant Examiner* — Sarah Salerno
(74) *Attorney, Agent, or Firm* — J.C. Patents

(57) ABSTRACT

A chip structure and a chip package structure are disclosed herein. The chip structure includes a chip and a bump. The chip includes at least one pad. The bump is disposed on a bounding region of the pad. The shape of the bump is triangular pillar or trapezoidal pillar. A surface area of connection between the bump and the pad is less than or equal to the bounding region. Therefore, the material usage and the cost of the bump can be reduced. In addition, such shape of the bump has directional characteristic so that it is easy to perform the chip testing via the identifiable pads, and perform the package process of bonding the chip to a circuit board or any carriers.

7 Claims, 4 Drawing Sheets

CHIP STRUCTURE AND CHIP PACKAGE STRUCTURE

BACKGROUND OF THE INVENTION

1. Field of the Invention

The present invention relates to a chip structure, and more particularly, to a chip structure that reduces the material usage of bump.

2. Description of Related Art

In the semiconductor industries, the production of integrated circuit (also known as IC, microcircuit, or chip) mainly includes three stages of manufacturing a wafer, forming the integrated circuit on the wafer and packaging the integrated circuit. The integrated circuits are produced in large batches on a single wafer through semiconductor processes, such as photolithography. The wafer is cut into many pieces, and each of these pieces is called as a die, on which a given functional circuit is fabricated. The die is electrically connected with carrier via the pads of the die for forming a chip package structure.

FIG. 1 shows a cross-section view of a conventional chip structure. Referring to FIG. 1, a chip 100 includes a patterned circuit 110, a plurality of pads 120 and a protective layer 130. The pads 120 are disposed on the patterned circuit 110, and the protective layer 130 is disposed on the patterned circuit 110 and a part region of each pad 120. The protective layer 130 includes a plurality of openings for exposing the said part region of each pad 120. Concretely speaking, the protective layer 130 covers the edges of the pads 120, and the central parts of the pads 120 are exposed via the openings.

In the chip structure, a plurality of gold bumps 140 are formed on the pads 120 for electrically connecting the chip 100 with the carrier, such as a packaged board or a flexible printed circuit board. The bumps 140 have the same shape of rectangle pillar, which cover the pads 120 exposed by the openings. As the increase of the gold material cost, the material usage of bump should be reduced to fit in with cost-benefit, but the bumps should maintain the minimum contact area of connecting to the carrier.

In addition, the identification of the pads is very important in the chip, which benefits the chip testing and the package process of bonding the chip to the carrier. For example, as known, a source driver in a display device has a plurality of odd driving channels and a plurality of even driving channels alternatively arranged. When testing a certain driving channel of the source driver, the engineers should count these driving channels for searching the one under test. The time spent on searching unidentifiable pads is wasted and helpless for testing whether the source driver can normally work or performing engineering analysis on the source driver. In package process, the identifiable pads are helpful to align the connection between the chip and the carrier. Therefore, it is worth to make efforts on a new design of the bumps disposed on the pads for reducing the cost and identifying the pads.

SUMMARY OF THE INVENTION

The present invention provides a chip structure including a bump having the shape of triangular pillar or trapezoidal pillar for reducing the material usage and the cost of the bump in the chip. The shape of the bump has directional characteristic so that another chip structure provided in the present invention includes a plurality of such bumps, which every two neighboring bumps have opposite directions, for being convenient to perform the chip testing and the alignment in package process via the identifiable pads.

The present invention further provides a chip package structure includes a plurality of leads, which every two neighboring leads have different forms of connecting with the bumps, for ensuring the package process of bounding the chip to a circuit board or any carrier is correct.

A chip structure is provided in the present invention. The chip structure includes a chip and a bump. The chip includes at least one pad. The bump is disposed on a bonding region of the pad. The shape of the bump is triangular pillar or trapezoidal pillar. A surface area of connection between the bump and the pad is less than or equal to the bonding region.

A chip structure is provided in the present invention. The chip structure includes a chip, a plurality of first bumps and a plurality of second bumps. The chip includes a plurality of pads, wherein the pads includes a plurality of first pads and a plurality of second pads alternatively disposed on the chip. The first bumps are respectively disposed on a plurality of first bonding regions of the first pads. The second bumps are respectively disposed on a plurality of second bonding regions of the second pads. The shape of each first bump is triangular pillar or trapezoidal pillar, and a surface area of connection between each first bump and each first pad is less than or equal to each first bonding region. The shape of each second bump is triangular pillar or trapezoidal pillar, and a surface area of connection between each second bump and each second pad is less than or equal to each second bonding region. The direction of each first bump is opposite to the direction of each second bump.

A chip package structure is provided in the present invention. The chip package structure includes a chip, a plurality of first bumps, a plurality of second bumps, a plurality of first leads and a plurality of second leads. The chip includes a plurality of pads, wherein the pads includes a plurality of first pads and a plurality of second pads alternatively disposed on the chip. The first bumps are respectively disposed on a plurality of first bonding regions of the first pads. The shape of each first bump is triangular pillar or trapezoidal pillar, and a surface area of connection between each first bump and each first pad is less than or equal to each first bonding region. The second bumps are respectively disposed on a plurality of second bonding regions of the second pads. The shape of each second bump is triangular pillar or trapezoidal pillar, and a surface area of connection between each first bump and each first pad is less than or equal to each second bonding region. The first leads are respectively disposed on the first bumps, wherein one terminal of each first lead connected to each first bump is within each first bump. The second leads are respectively disposed on the second bumps, wherein one terminal of each second lead connected to each second bump is over each second bump.

The present invention utilizes the bump having the shape of triangular pillar or trapezoidal pillar to reduce material usage of the bump in the chip. Such shape of the bump keeps the contact area of connecting the chip with a circuit board or any carrier, and has directional characteristic. In another chip structure, the first bump disposed on the first pad and the second bump disposed on the second pad have opposite directions for identifying the pad as the first pad or the second pad. This design of the chip structure is convenient for performing the chip testing and performing the alignment in the package process. Furthermore, in the chip package structure, the form of connection between the first lead and the first bump is different to the form of connection between the second lead and the second bump so that the accuracy of bonding the chip to the circuit board or any carriers via the identifiable pads can be increased.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
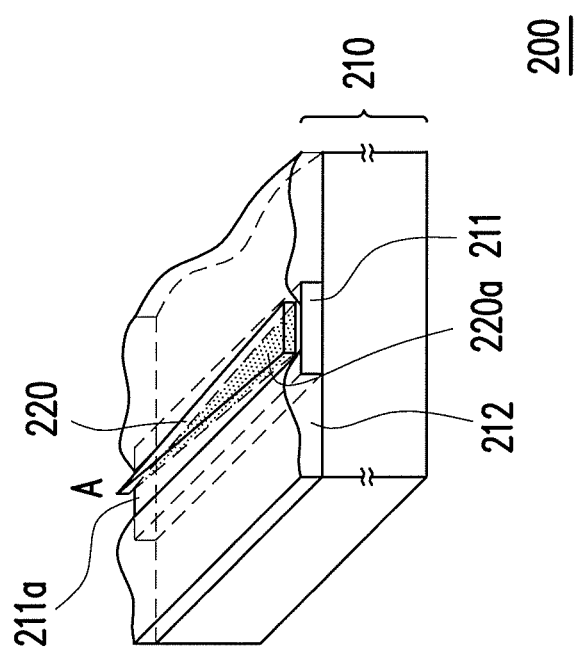
FIG. 2 shows a cross-sectional view of a chip structure according to an embodiment of the present invention.

FIG. 2 shows a cross-sectional view of a chip structure according to an embodiment of the present invention. Referring to FIG. 2, the chip structure 200 includes a chip 210 and a bump 220. The chip 210 includes a pad 211 and a protective layer 212, wherein the pad 211 has a bonding region 211a. The protective layer 212 is partly disposed on the pad 211, and the protective layer 212 has a first opening to expose a part of the bonding region 211a. The bump 220 having the shape of triangular pillar is disposed on the bonding region 211a exposed by the first opening. A surface area 220a of connection between the bump 220 and pad 211 is less than the bonding region 211a. Besides, the surface area 220a of connection between the bump 220 and pad 211 can be equal to the bonding region 211a if the first opening of the protective layer 212 is made to expose the boning region 211a having the same shape as the bump 220, and the present invention is not limited to the shape of the pad 211.

In the embodiment of FIG. 2, for the same bonding region of the pad 211, the bump 220 having the shape of triangular pillar consumes less material, such as gold, than that having the shape of rectangular pillar in the prior art so that the material usage of the bump and the cost can be reduced. Such shape of the bump 220 would not affect the contact area of bonding the bump 220 to an inner lead in package process. Besides, the bump 220 has directional characteristic, e.g. the vertex A of the bump 220 indicating one terminal of the pad 211, so that the bump 220 is helpful to identify the pad 211 and the detail will be described later.

Figure 1:
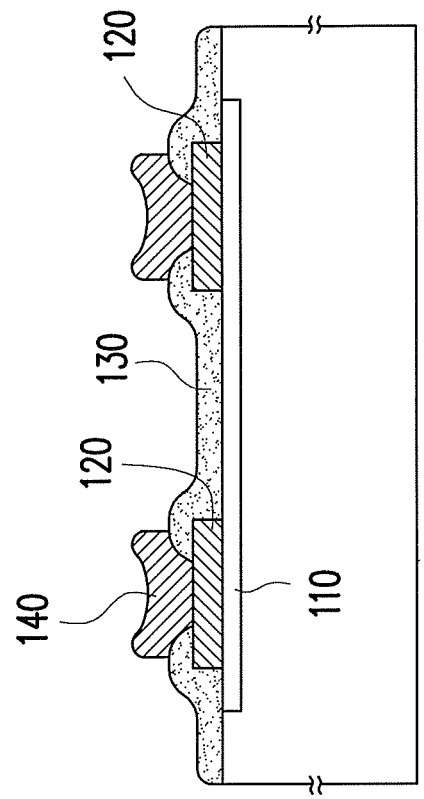
FIG. 1 shows a cross-section diagram of a conventional chip structure.
Figure 3:
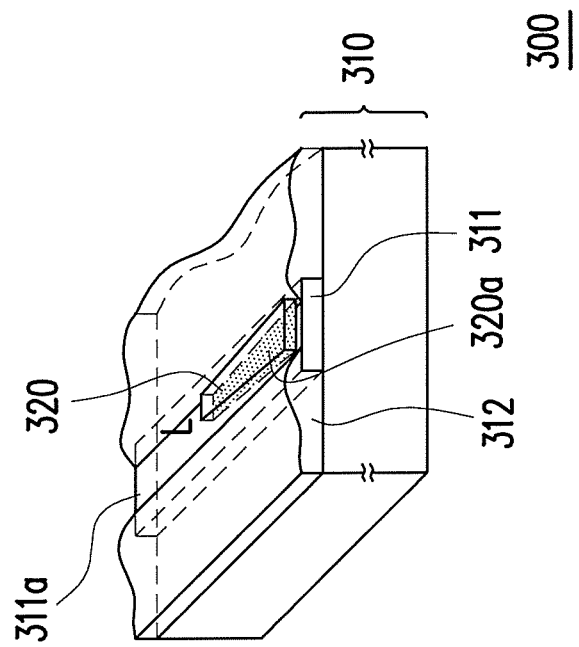
FIG. 3 shows a cross-sectional view of a chip structure according to another embodiment of the present invention.

FIG. 3 shows a cross-sectional view of a chip structure according to another embodiment of the present invention. Referring to FIG. 2 and FIG. 3, the difference between FIG. 2 and FIG. 3 is that the bump 320 in FIG. 3 has the shape of trapezoidal pillar, which consumes less material than the bump 220 in FIG. 2. The bump 320 also had directional characteristic for identifying the pad 311, e.g. the short side L of the bump 320 indicating one terminal of the pad 311.

It is noted that the embodiments in FIG. 2 and FIG. 3 are not limited in the shape of the pads 211 and 311. Namely, by the process technique, the bonding region 211a of the pad 211 can be made rectangle or triangle, and the bonding region 311a of the pad 311 can be made any one of rectangle, triangle and trapezoid.

Figure 4:
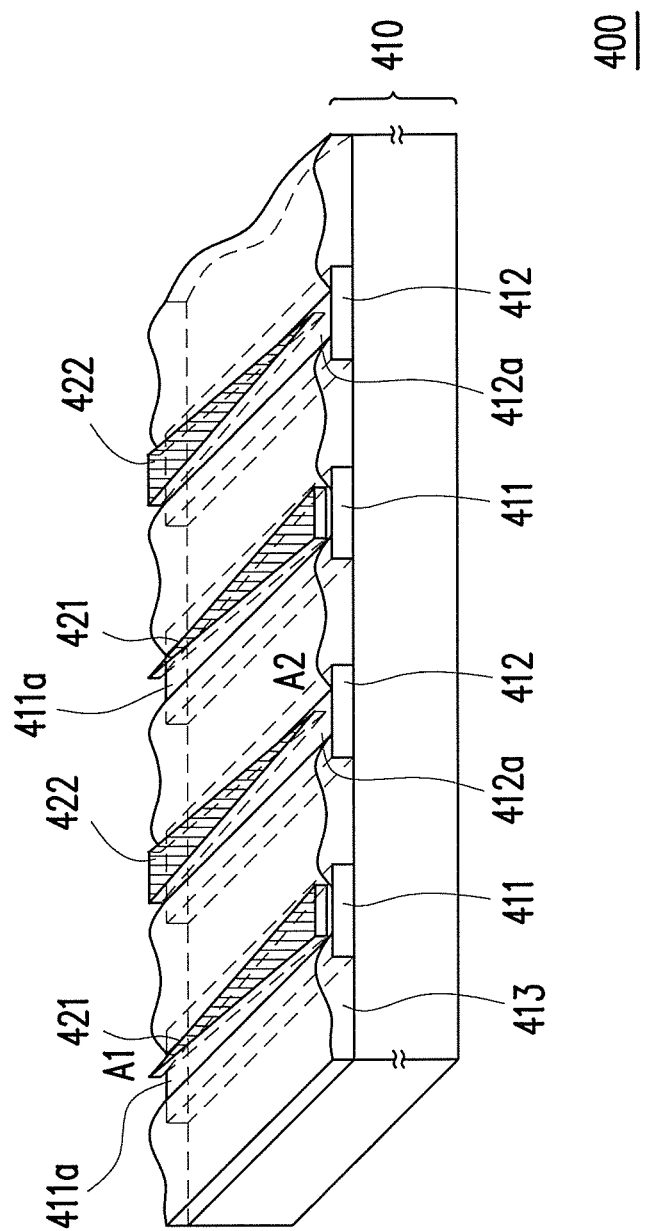
FIG. 4 shows a cross-sectional view of a chip structure according to another embodiment of the present invention.

In order to make people easily put the present invention into practice, there is still another embodiment. FIG. 4 shows a cross-sectional view of a chip structure according to another embodiment of the present invention. The chip structure 400 includes a chip 410, a plurality of first bumps 421 and a plurality of second bumps 422. The chip 410 includes a plurality of pads and a protective layer 413, wherein the pads includes a plurality of odd pads 411 and a plurality of even pads 412 alternatively disposed on the chip 410. The odd pads 411 respectively have a plurality of first bonding regions 411a, and the even pads 412 respectively have a plurality of second bonding regions 412a. The protective layer 413 is partly disposed on the pads. The protective layer 413 has a plurality of first openings exposing the first bonding regions 411a and a plurality of second openings exposing the second bonding regions 412a.

The first bumps 421 are respectively disposed on the first bonding regions 411a exposed by the first openings, wherein the shape of each first bump 421 is triangular pillar, and a surface area 421a of connection between each first bump 421 and each odd pad 411 is less than or equal to each first bonding region 411a. The second bumps 422 are respectively disposed on the second bonding regions 412a exposed by the second openings, wherein the shape of each second bump 422 is triangular pillar, and a surface area 422a of connection between each second bump 422 and each even pad 412 is less than or equal to each second bonding region 412a. In the embodiment, the direction of each first bump 421 is opposite to the direction of each even bump 422 for identifying the pad as the odd pad or the even pad.

For example, the vertex A1 of the first bump 421 can indicate the odd pad 411, and the vertex A2 of the second bump 422 can indicate the even pad 412. Therefore, the embodiment of FIG. 4 not only can reduce the material usage of the bumps in the chip, but also can identify the pad as the odd pad or the even pad for easily performing the chip testing, and the alignment in the package process.

As the foregoing description in the embodiment of FIG. 3, the first bumps 421 and the second bumps 422 can have the shape of trapezoidal pillar for further reducing the material usage of the bumps and the cost. Besides, the shape of the pad should not be limited in the embodiment, that is, each of the first bonding region 411a and the second bonding regions 412a can be any one of rectangle, triangle and trapezoid.

Figure 5:
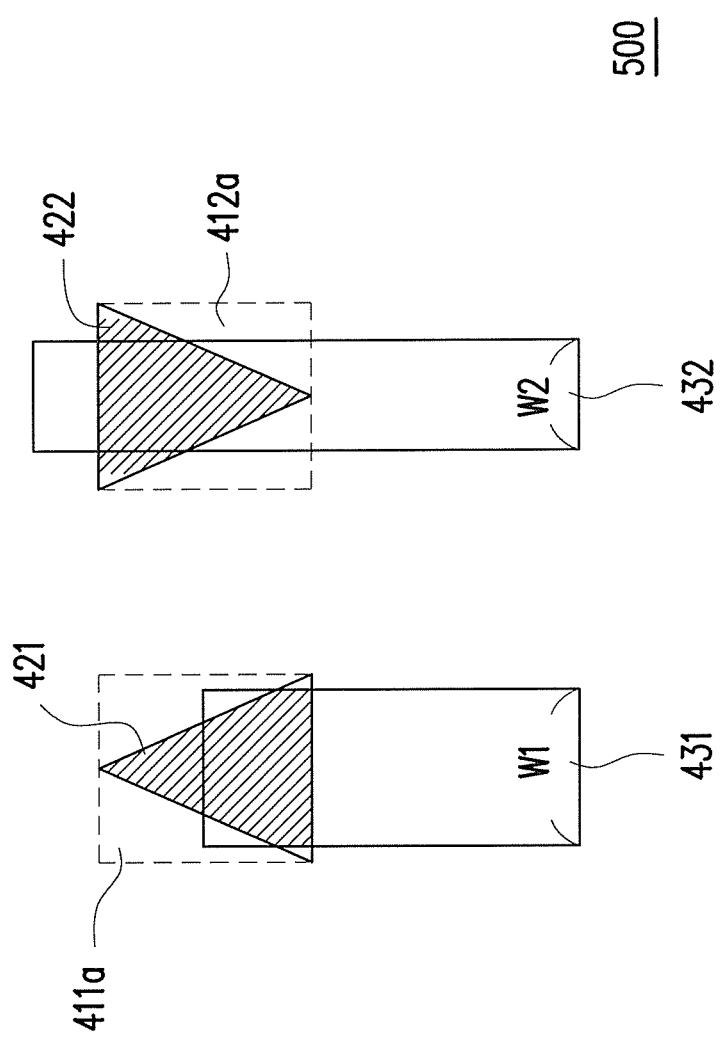
FIG. 5 shows a top view of a chip package structure according to an embodiment of the present invention.

FIG. 5 shows a top view of a chip package structure according to an embodiment of the present invention. Referring to FIG. 4 and FIG. 5, in the package process, the bumps, such as the first bumps 421 and the second bumps 422, on the chip 410 should be electrically connected to the inner leads, respectively. Then, the chip 410 and the inner leads are packaged together by using protective material, such as resin. In the embodiment of FIG. 5, the chip package structure 500 includes the chip 410 having been performed the bump process, a plurality of first leads 431, and a plurality of second leads 432.

The first leads 431 are respectively disposed on the first bumps 421 and electrically connected to the first bumps 421, wherein one terminal of the first lead 431 is located within the first bump 421. The second leads 432 are respectively disposed on the second bumps 422 and electrically connected to the second bumps 422, wherein two terminals of the second lead 432 are located over the second bump 422. In the embodiment of FIG. 5, the form of connection between the first lead 431 and the first bump 421 and the form of connection between the second lead 432 and the second bump 422 can ensure the package process of bonding the chip 410 to the carrier is correct.

For example, the shorter lead (i.e. the first lead 431) is correctly connected to the odd pad 411 identified by the first bump 421, and the longer lead (i.e. the second lead 432) is correctly connected to the even pad 412 identified by the second bump 422. Therefore, the embodiment of FIG. 5 shows a design helpful to align the connection between the chip and the carrier. Besides, the width W1 of the first lead 431 can be greater than the width W2 of the second lead 432 for increasing the contact area of connecting the first lead 431 to the first bump 421.

In summary, the said embodiments utilize the bump having the shape of triangular pillar or trapezoidal pillar to reduce material usage of the bump in the chip. Such shape of the bump has directional characteristic so that in embodiment of FIG. 4, the first bump disposed on the odd pad and the second bump disposed on the even pad have opposite directions for identifying the pad as the odd pad or the even pad. This design of the chip structure is convenient for performing the chip testing, and the alignment in the package process. Furthermore, in the chip package structure, the form of connection between the first lead and the first bump is different to the form of connection between the second lead and the second bump so that the accuracy of bonding the chip to the circuit board or any carriers via the identifiable pads can be increased.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A chip package structure, comprising:
   a chip, comprising a plurality of pads, wherein the pads includes a plurality of first pads and a plurality of second pads alternatively disposed on the chip, the first pads have a plurality of first bonding regions respectively, and the second pads have a plurality of second bonding regions respectively;
   a plurality of first bumps, respectively disposed on the first bonding regions, wherein the shape of each first bump is triangular pillar or trapezoidal pillar, and a surface area of connection between each first bump and each first pad is less than each first bonding region;
   a plurality of second bumps, respectively disposed on the second bonding regions, wherein the shape of each second bump is triangular pillar or trapezoidal pillar, and a width of each first bump is decreased along a first direction and a width of each second bump is decreased along a second direction opposite to the first direction and a surface area of connection between each second bump and each second pad is less than each second bonding region;
   a plurality of first leads, respectively disposed on and electrically connected to the first bumps, wherein one terminal of each first lead connected to each first bump is located above and within each first bump; and
   a plurality of second leads, respectively disposed on and electrically connected to the second bumps, wherein one terminal of each second lead connected to each second bump is located above and extends beyond each second bump, a width of each first lead is larger than a width of each second lead.

2. The chip package structure as claimed in claim 1, wherein the chip further comprises:
   a protective layer, disposed on the pads, wherein the protective layer has a plurality of first openings exposing the first bonding regions respectively and a plurality of second openings exposing the second bonding regions respectively.

3. The chip package structure as claimed in claim 1, wherein the direction of each first bump is opposite to the direction of each second bump.

4. The chip package structure as claimed in claim 1, wherein the direction of each first bump is same as the direction of each second bump.

5. The chip package structure as claimed in claim 1, wherein each first bonding region is any one of rectangle, triangle and trapezoid.

6. The chip package structure as claimed in claim 1, wherein each second bonding region is any one of rectangle, triangle and trapezoid.

7. The chip package structure as claimed in claim 1, wherein the first pads and the second pads are the odd pads and the even pads respectively.

* * * * *